(12) United States Patent
Houston

(10) Patent No.: US 6,362,058 B1
(45) Date of Patent: Mar. 26, 2002

(54) METHOD FOR CONTROLLING AN IMPLANT PROFILE IN THE CHANNEL OF A TRANSISTOR

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/697,922

(22) Filed: Oct. 26, 2000

Related U.S. Application Data

(60) Provisional application No. 60/171,729, filed on Dec. 22, 1999.

(51) Int. Cl.[7] .................................................. H01L 21/336
(52) U.S. Cl. ........................ 438/286; 438/305; 438/306; 438/307; 438/529
(58) Field of Search .................................... 438/289, 305, 438/303, 230, 231, 183–5, 179, 181, 307, 529, 286

(56) References Cited

U.S. PATENT DOCUMENTS

| | | | | |
|---|---|---|---|---|
| 4,559,693 A | * | 12/1985 | Kamei | 29/571 |
| 4,597,827 A | * | 7/1986 | Nishitani et al. | 156/643 |
| 4,769,339 A | * | 9/1988 | Ishii | 438/179 |
| 4,992,387 A | * | 2/1991 | Tamura | 438/174 |
| 5,082,794 A | * | 1/1992 | Pfiester et al. | 438/589 |
| 5,187,112 A | * | 2/1993 | Kohno et al. | 438/179 |
| 5,523,246 A | * | 6/1996 | Yang | 438/220 |
| 5,688,700 A | * | 11/1997 | Kao et al. | 438/589 |
| 5,899,719 A | * | 5/1999 | Hong | 438/289 |
| 5,960,270 A | * | 9/1999 | Misra et al. | 438/197 |
| 5,998,274 A | * | 12/1999 | Akram et al. | 438/306 |
| 6,107,130 A | * | 8/2000 | Fulford, Jr. et al. | 438/231 |
| 6,121,099 A | * | 9/2000 | Fulford, Jr. et al. | 438/301 |
| 6,165,827 A | * | 12/2000 | Ahmad et al. | 438/231 |
| 6,177,318 B1 | * | 1/2001 | Ogura et al. | 438/267 |

FOREIGN PATENT DOCUMENTS

EP 0218408-a2 * 9/1986

* cited by examiner

Primary Examiner—Jerome Jackson, Jr.
Assistant Examiner—Paul E Brock, II
(74) Attorney, Agent, or Firm—Pedro P. Hernandez; W. James Brady, III; Frederick J. Telecky, Jr.

(57) ABSTRACT

A method of fabricating an integrated circuit (10, 51, 61, 71, 81, 91) includes forming on the upper surface (13) of a substrate (12) a part (18) which has thereon a side surface (19). A plurality of sidewalls (22, 27 and 83–84) are then formed in succession, outwardly from the side surface. A plurality of successive implants (21, 26, 31, 73–74, 87–88, 93–94) are introduced into the substrate, where a respective different subset of the sidewalls is present when each implant is created. The formation of sidewalls and implants may be carried out in an alternating manner, followed by removal of the sidewalls. Alternatively, removal of the sidewalls and formation of the implants may be carried out in an alternating manner. The width of each sidewall may be sublithographic, and the cumulative width of all sidewalls may be sublithographic.

13 Claims, 5 Drawing Sheets

METHOD FOR CONTROLLING AN IMPLANT PROFILE IN THE CHANNEL OF A TRANSISTOR

CROSS-REFERENCE TO RELATED APPLICATIONS

This application claims priority under 35 USC §119(e)(1) of provisional application No. 60/171,729 filed Dec. 12, 1999.

The present application is related to U.S. Ser. No. 09/349,626 filed Jul. 8, 1999 and entitled "Selectively Increased Interlevel Capacitance;" U.S. Ser. No. 09/368,387 filed Aug. 4, 1999 and entitled "Asymmetrical Devices for Short Gate Length Performance With Disposable Sidewall;" U.S. Ser. No. 09/098,188 filed Jun. 16, 1998 and entitled "Process for Defining Ultra-Thin Geometries;" and U.S. Ser. No. 60/171,770 filed Dec. 22, 1999 and entitled "Integrated Circuit With Closely Spaced Components, and a Method of Making It."

TECHNICAL FIELD OF THE INVENTION

This invention relates in general to fabrication of integrated circuits and, more particularly, to control of an implant profile in the channel region of a field effect transistor.

BACKGROUND OF THE INVENTION

When fabricating an integrated circuit which includes a field effect transistor, it is common to introduce at least one implant into the channel region between the source and drain regions, where each such implant involves doping of the semiconductor substrate in the channel region. The doping level in the channel region is much lighter than the doping levels in the source and drain regions.

It is often advantageous or desirable to have an implant profile in the channel which is not constant, but instead varies from the source to the drain. For example, it may vary in terms of the level of doping, and/or the depth of the doping. Examples of pre-existing approaches to profiling include diffusing material into the channel from the sides, or carrying out an angled implant from each side of a gate structure. While these known techniques have been generally adequate for their intended purposes, they have not been satisfactory in all respects.

The length of the channel itself is often so short that it approaches the limits of existing lithographic capabilities, and close alignment tolerances are thus needed for the various lithographic steps used to form the major elements of the transistor, such as the source, drain, gate and channel. Where the channel length itself approaches the limits of lithographic processes, achieving variation of an implant profile within the channel essentially involves sublithographic considerations that have been problematic.

For similar reasons, it has also been problematic to fabricate gate structures which have lengths that are sublithographic. Further, it has been a problem to fabricate gate lengths which approach sublithographic dimensions, and which do not require close alignment considerations for lithographic steps which are involved.

SUMMARY OF THE INVENTION

From the foregoing, it may be appreciated that a need has arisen for a method of fabricating an integrated circuit, which allows accurate control of the fabrication of certain structural features, such as accurate control of implant profiling or gate length in a field effect transistor at a sublithographic level, without a need for close alignment tolerances for lithographic steps. According to the present invention, a method is provided to address this need, and involves: providing a substrate having an upwardly facing first surface; forming on the first surface a part which has thereon a second surface that faces sidewardly; successively forming a plurality of sidewalls, including a first sidewall on the second surface and a second sidewall on the first sidewall; removing the sidewalls; and introducing an implant into the substrate, wherein a subset of the sidewalls is present when the implant is introduced into the substrate. The subset may contain no sidewalls, one sidewall, or at least two sidewalls at the time of the implant. According to another form of the present invention, a plurality of successive implants are introduced into the substrate, wherein a respective different subset of the sidewalls is present when each implant is introduced into the substrate.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
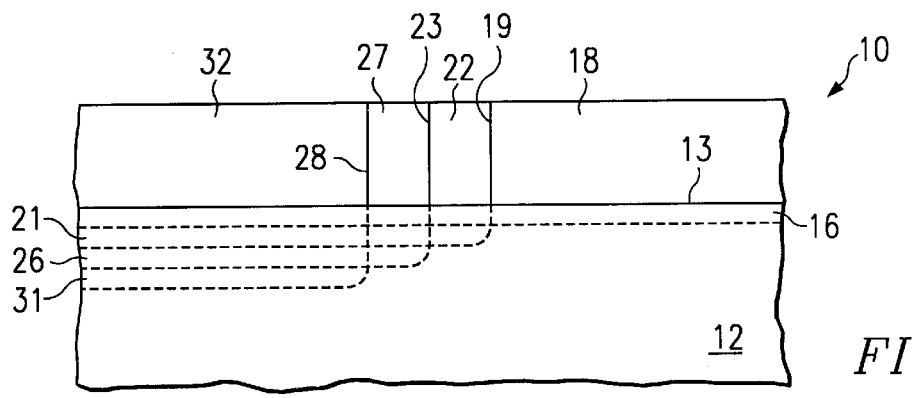
FIGS. 1–4 are each a diagrammatic sectional side view of an integrated circuit, and show the integrated circuit at respective successive stages during its fabrication according to a method which embodies the present invention.

FIGS. 1–4 are each a diagrammatic sectional side view of an integrated circuit 10, and show the integrated circuit 10 at respective successive stages during its fabrication according to a method which embodies the present invention. The integrated circuit 10 includes a silicon substrate 12 having on an upper side thereof an upwardly facing surface 13. A first implant layer 16 is introduced into the substrate 12 through the upper surface 13. As is known in the art, this is carried out using a standard doping technique, typically involving doping with phosphorus, antimony, boron or arsenic.

Thereafter, a dielectric layer 18 is formed on the upper surface 13 of the substrate 12. The dielectric layer 18 may, for example, be silicon dioxide. The dielectric layer 18 is subjected to a patterned etch in a known manner, so as to define thereon a sidewardly facing side surface 19. A further implant layer 21 is then introduced into the substrate 12, except where the dielectric layer 18 blocks access to the substrate 12.

A sidewall 22 is then formed on the side surface 19 with its lower edge engaging the surface 13, for example by depositing a layer of material on top of the device 10, and then doing a vertical etch so as to leave only the portion of the material which defines the sidewall 22. The sidewall 22 should be made from a material which can be selectively etched with respect to the dielectric layer 18. In the embodiment of FIGS. 1–4, the sidewall 22 is made of a nitride material, but it could alternatively be some other material such as a polysilicon material, or an organic material such as a polyamide. The sidewall 22 has on a side thereof opposite from the dielectric layer 18 a sidewardly facing side surface 23. In the embodiment of FIGS. 1–4, the width or thickness of the sidewall 22, or in other words the distance between surfaces 19 and 23, is sublithographic. In this regard, known techniques allow the sidewall 22 to be formed with very accurate control of its width or thickness, even at sublithographic dimensions.

A further implant 26 is then introduced into the substrate 12 from the upper side thereof, except in regions covered by the dielectric layer 18 and sidewall 22. Then, a further sidewall 27 is formed on the side surface 23 of sidewall 22 with its lower edge engaging the surface 13. In the embodiment of FIG. 1, the sidewall 27 is made from the same material as the sidewall 22, but it could alternatively be a different material. The sidewall 27 has on a side thereof opposite from the sidewall 22 a sidewardly facing side surface 28. The width or thickness of sidewall 27, or in other words the distance between surfaces 23 and 28, is sublithographic in the embodiment of FIG. 1. Further, the combined width or thickness of both of the sidewalls 22 and 27, or in other words the distance between surfaces 19 and 28, is sublithographic.

A further implant layer 31 is then introduced into the substrate 12 from the upper side thereof, except where the substrate is covered by the dielectric layer 18 and the sidewalls 22 and 27. Then, a further dielectric layer 32 is formed on the upper surface 13 of the substrate 12, with a side surface which engages the side surface 28 on sidewall 27. In the embodiment of FIG. 1, the dielectric layer 32 is made of the same material as dielectric layer 18, and is formed by depositing a layer of the dielectric material over the entire device and by then carrying out a planarization, for example using a known chemical mechanical polishing (CMP) technique. It will be noted from FIG. 1 that the degree of doping due to implants 16, 21, 26 and 31 represents a profile which increases progressively from right to left. That is, the profile is asymmetric. Moreover, since the widths of the sidewalls 22 and 27 are sublithographic, the implant profile varies sublithographically. Although FIG. 1 shows an implant profile which involves a progressively increasing depth from right to left, it will be recognized that variations are possible, including variation of doping density or species type. Further, although the foregoing explanation of FIG. 1 discussed the formation of two sidewalls 22 and 27 which were each followed by a respective implant 26 and 31, it will be recognized that more than two sidewalls could be used, with the formation of each such sidewall followed by a respective implant.

Figure 2:
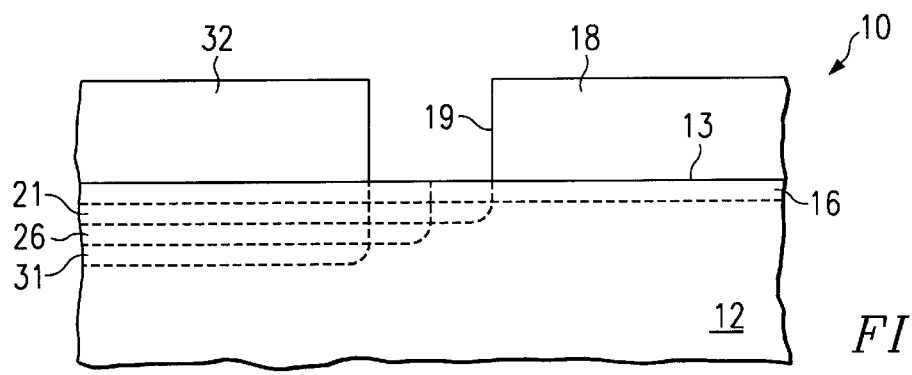

Next, the sidewalls 22 and 27 are each removed using a selective etch process, in particular a known process which etches away the material of sidewalls 22 and 27 but not the material of dielectric layers 18 and 32. After this etch process, the device 10 appears as shown in FIG. 2.

Figure 3:
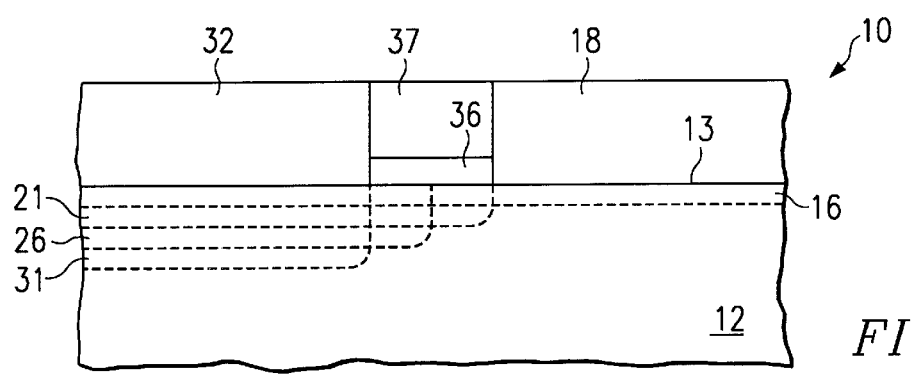
Figure 4:
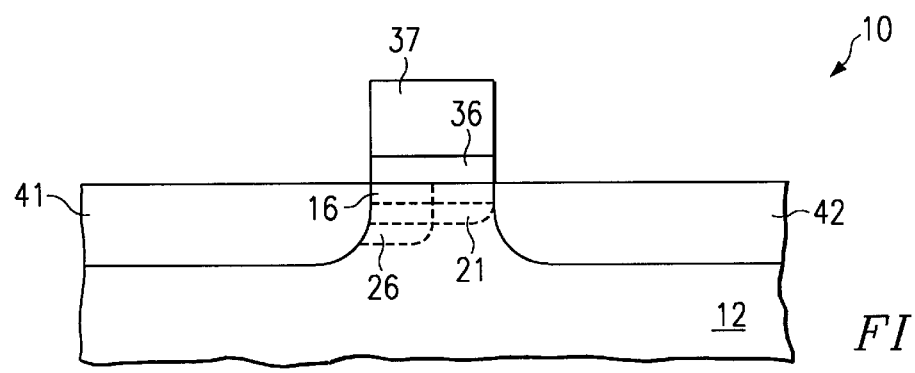

Next, with reference to FIG. 3, a gate structure is formed in the region which was occupied by sidewalls 22 and 27, including a gate dielectric layer 36 made of a material such as silicon dioxide, and a gate electrode 37 made of a material such as polysilicon. The gate dielectric layer 36 may be grown on the exposed surface of substrate 12, or may alternatively be deposited. The gate material 37 would typically be deposited and then planarized according to a known damascene technique, so as to yield the configuration shown in FIG. 3. Then, a selective etch is carried out in order to remove the material of the dielectric layers 18 and 32, leaving the gate structure 36–37 as shown in FIG. 4.

Source and drain regions 41 and 42 are then formed in a known manner within the substrate 12, on opposite sides of the gate structure 36–37. The source and drain regions 41–42 are each created by doping the substrate, typically with doping materials of the same type already discussed above. The doping levels used for the source and drain are significantly higher than the doping levels used for the implants 16, 21, 26 and 31. Consequently, in the source and drain regions 41–42, the doping due to the implants is effectively negligible in comparison to the doping used to create the source and drain regions themselves, and thus the implants are not depicted in FIG. 4 within the source and drain regions.

Further fabrication of the integrated circuit 10 is subsequently carried out in a known manner, and the structure shown in FIG. 4 ultimately serves as a field effect transistor (FET) in the completed device. It will be noted that, in the channel region between the source 41 and drain 42, the various different implants cumulatively define an asymmetric implant or doping profile which increases progressively from the drain to the source. It will also be noted that the gate length and the profiling within the channel are each sublithographic, without any need for strict alignment during the lithographic steps which are involved.

As a variation of the embodiment of FIGS. 1–4, nitride sidewalls could be added in a known manner to opposite sides of the gate structure 36–37, after which the source and drain regions 41–42 would be formed. Due to the fact that the overall gate structure, including the sidewalls, would be slightly wider than just the dielectric and electrode 36–37, the source and drain regions 41 and 42 would be slightly further apart than shown in FIG. 4. As a result, the portion of the implant 16 disposed between the drain 42 and the gate dielectric 36 would function to some extent as a shallow drain extension or as a pocket implant. Similarly, the portion of the four implants 16, 21, 26 and 31 disposed between the source 41 and the gate dielectric 36 would function to some extent as a shallow source extension. In this configuration, of course, the source and drain extensions would not be symmetric.

Figure 5:
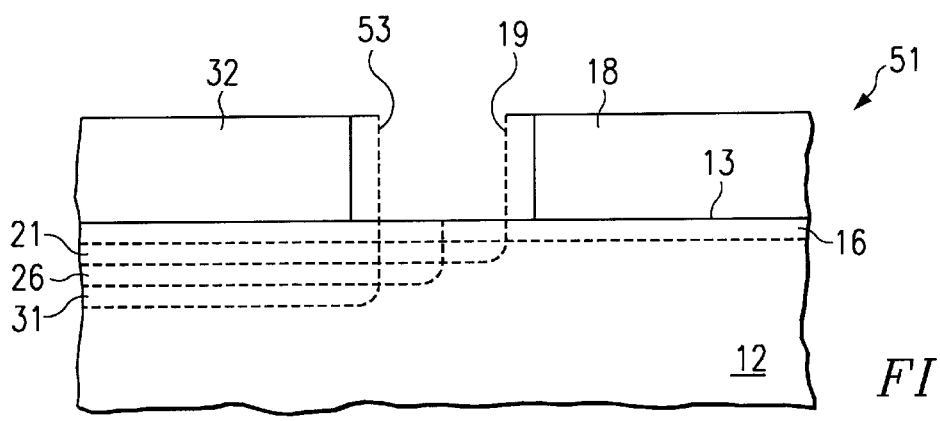
FIGS. 5–6 are diagrammatic sectional side views of an alternative embodiment of the integrated circuit of FIGS. 1–4, depicting respective successive stages during its fabrication according to an alternative form of the method which embodies the present invention.
Figure 6:
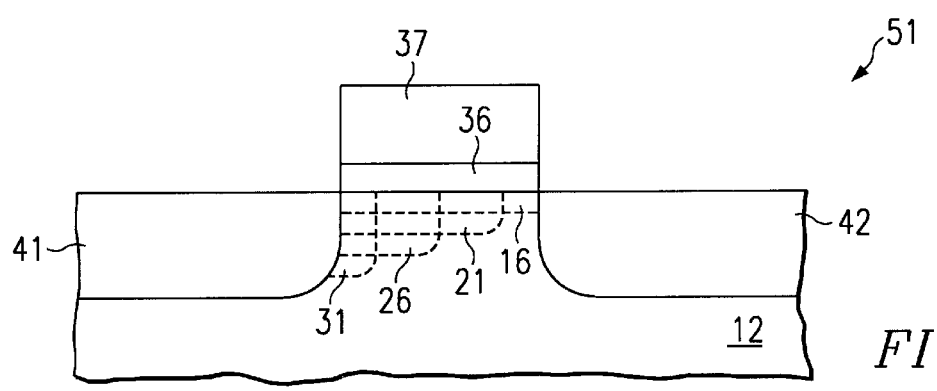

FIGS. 5 and 6 are each a diagrammatic sectional side view of an integrated circuit 51 which is an alternative embodiment of the integrated circuit 10 of FIGS. 1–4, and show the integrated circuit 51 at respective successive stages during its fabrication. The initial fabrication of the integrated circuit 51 is carried out in the same manner described above for the integrated circuit 10 in association with FIGS. 1 and 2. Then, when the integrated circuit 51 has reached the stage shown in FIG. 2, an etch process is carried out to remove some material from each of the dielectric layers 18 and 32, in a manner which etches back the surface 19 on the layer 18 and a surface 53 on the layer 32. In essence, the distance between the dielectric layers 18 and 32 is increased, which in turn effects an increase in the length of the gate structure which will be formed between them. This permits sublithographic adjustment of the gate length, for example in relation to the channel length.

Subsequent processing of the integrated circuit 51 is then carried out in a manner similar to that described above for the integrated circuit 10 of FIGS. 1–4, resulting in the configuration of integrated circuit 51 which is shown in FIG. 6. It will be noted that, because of the increased length of the gate structure 36–37, portions of the outer implants 16 and 31 are uncovered and therefore play a more significant role in the integrated circuit 51 of FIG. 6 than in the integrated circuit 10 of FIG. 4.

Figure 7:
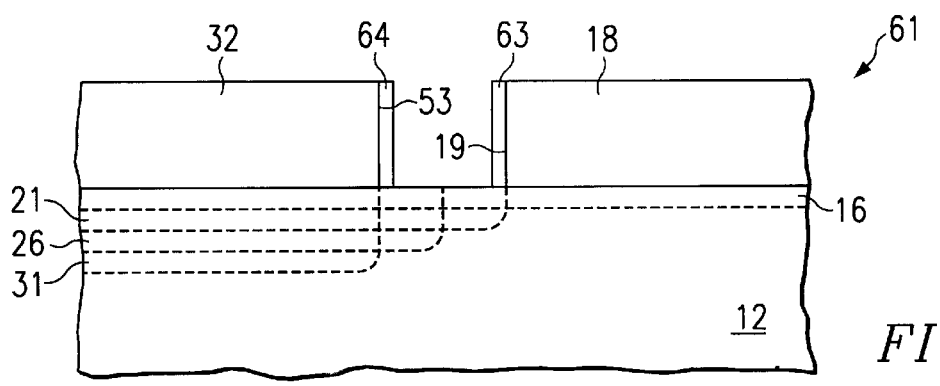
FIG. 7 is a diagrammatic sectional side view of an alternative embodiment of the integrated circuit of FIGS. 1–4, depicting it at an intermediate stage during its fabrication according to an alternative form of the method which embodies the present invention.
Figure 8:
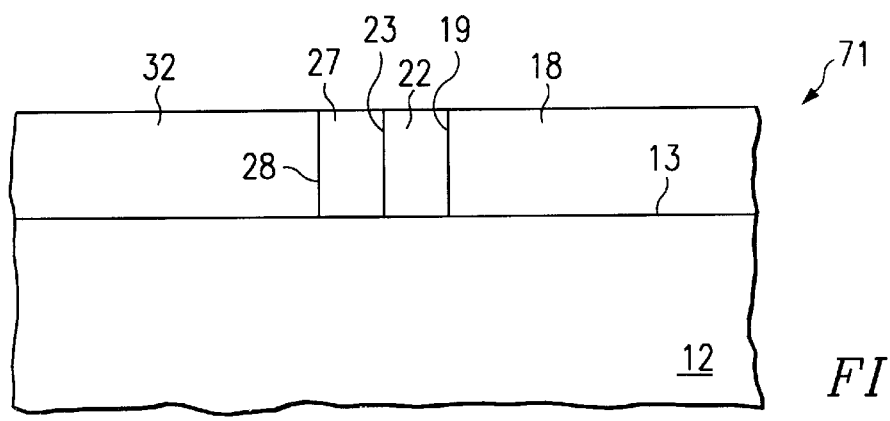
FIGS. 8–11 are diagrammatic sectional side views of an alternative embodiment of the integrated circuit of FIGS. 1–4, depicting respective successive stages during its fabrication according to an alternative form of the method which embodies the present invention.

FIG. 7 is a diagrammatic sectional side view of an integrated circuit 61 which is a further alternative embodiment of the integrated circuit 10 of FIGS. 1–4. Initial fabrication of the integrated circuit 61 is carried out in the same manner as that described above for the integrated circuit 10 in association with FIGS. 1 and 2.

When the integrated circuit 61 has reached the stage shown in FIG. 2, two relatively thin sidewalls 63 and 64 are respectively formed on the side surfaces 19 and 53 of the dielectric layers 18 and 32. In the embodiment of FIG. 7, the sidewalls 63 and 64 are made of the same dielectric material as the layers 18 and 32. The addition of the thin sidewalls 63 and 64 has the effect of reducing the distance between the dielectric layers 18 and 32, and thus shortening the effective length of the gate structure which will be formed between them. This permits a sublithographic adjustment in the length of the gate structure.

After the formation of the sidewalls 63 and 64, further processing is carried out in a manner similar to that described above in association with FIGS. 3 and 4, including formation of a gate structure between the sidewalls 63 and 64, followed by removal of the dielectric material of the sidewalls 63–64 and the layers 18 and 32.

FIGS. 8–11 are diagrammatic sectional side views of an integrated circuit 71 which is a further alternative embodiment of the integrated circuit 10 of FIGS. 1–4. Initial fabrication of the integrated circuit 71 is carried out in a manner similar to that described above in association with FIG. 1, with two differences. First, no implants are introduced into the substrate 12 during formation of the dielectric layer 18, the sidewalls 22 and 27, and the dielectric layer 32. Second, the sidewalls 22 and 27 are made of respective different materials, which are capable of being selectively etched relative to each other, and also relative to the material of the dielectric layers 18 and 32. This results in the structure shown in FIG. 8.

Figure 9:
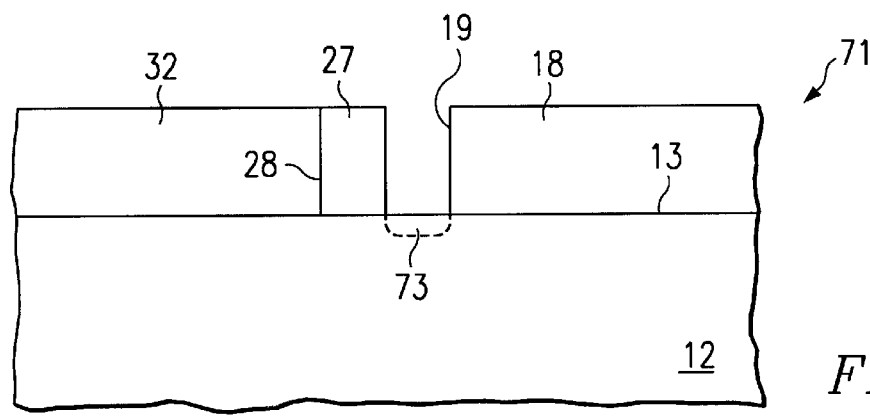

Next, a selective etch process is carried out according to a known technique, in order to remove the material of sidewall 22, as shown in FIG. 9. Then, an implant 73 is introduced into the substrate 12, except where the substrate is covered by the sidewall 27 and the dielectric layers 18 and 32. In essence, the implant 73 is created where the substrate is exposed as a result of the removal of the sidewall 22. After creation of the implant 73, the integrated circuit 71 has the configuration shown in FIG. 9.

Figure 10:
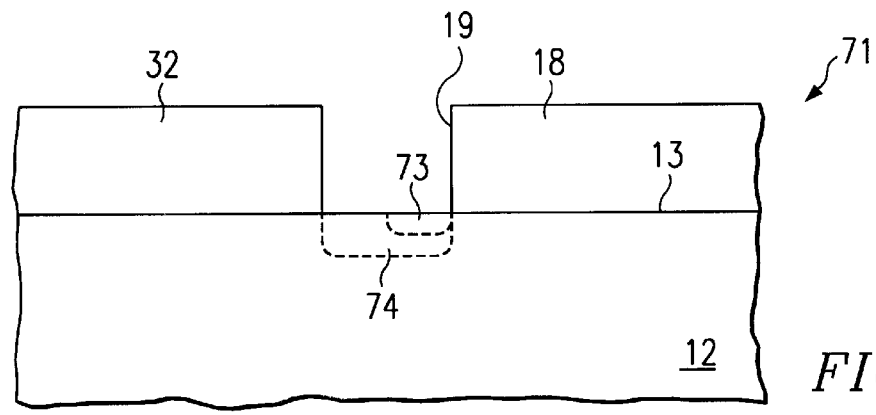

Next, a further selective etch is carried out so as to remove the sidewall 27, as shown in FIG. 10. Then, a further implant 74 is introduced into the substrate 12, except where the substrate is covered by the dielectric layers 18 and 32. In effect, the implant 74 is formed where the substrate 12 is exposed as a result of the removal of the sidewalls 22 and 27. Following creation of the implant 74, the configuration of the integrated circuit 71 is as shown in FIG. 10.

Figure 11:
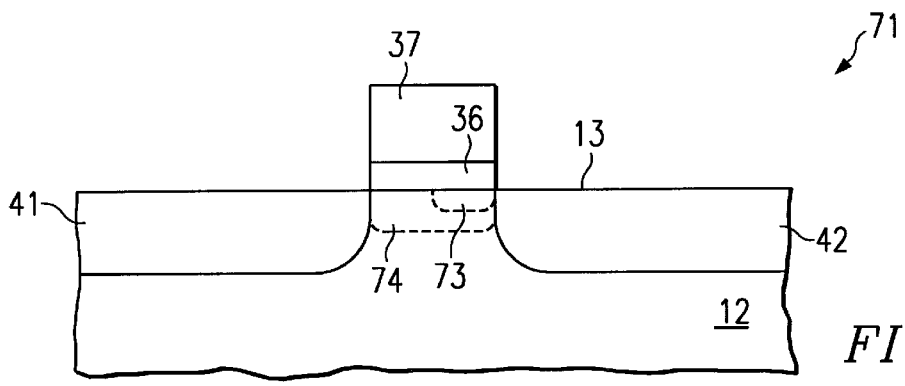

After this point, fabrication of the integrated circuit 71 is carried out in a manner similar to that described above for the integrated circuit 10 in association with FIGS. 3 and 4. In particular, a gate structure 36–37 is formed between the dielectric layers 18 and 32, the dielectric layers 18 and 32 are removed by etching, and source and drain regions 41–42 are formed on opposite sides of the gate structure. The integrated circuit 71 will then appear as shown in FIG. 11. It will be noted that the channel region has an asymmetrical implant profile which is sublithorgraphic and varies progressively from the source 41 to the drain 42. It will also be noted that the implant 74 provides an advantage over a blanket implant which included not only the channel region but also the source and drain regions 41–42, because the implant 74 does not have any effect on the source and drain regions 41–42.

Although FIG. 11 shows the implants 73 and 74 as having different depths, it will be recognized that they could alternatively have the same depth. As another alternative, implant 74 could optionally be omitted.

FIGS. 12–15 are diagrammatic sectional side views of an integrated circuit 81 which is an alternative embodiment of the integrated circuit 71 of FIGS. 8–11. Initial fabrication of the integrated circuit 81 is carried out in a manner similar to that described above for the integrated circuit 71 in association with FIG. 8, with one exception. In particular, after formation of the sidewall 27, two additional sidewalls 83 and 84 are formed before the dielectric layer 32 is added. The outer sidewalls 22 and 84 are formed of one material, and the inner sidewalls 27 and 83 are formed of a different material which may be selectively etched relative to the outer sidewalls 22 and 84 and the dielectric layers 18 and 32. In the embodiment of FIGS. 12–15, the sidewalls 22, 27 and 83–84 each have a width or thickness which is sublithographic, and the cumulative width or thickness of these four sidewalls is also sublithographic. However, it will be recognized that the cumulative width or thickness of these four sidewalls could alternatively be sufficiently large that it is not sublithographic.

Figure 12:
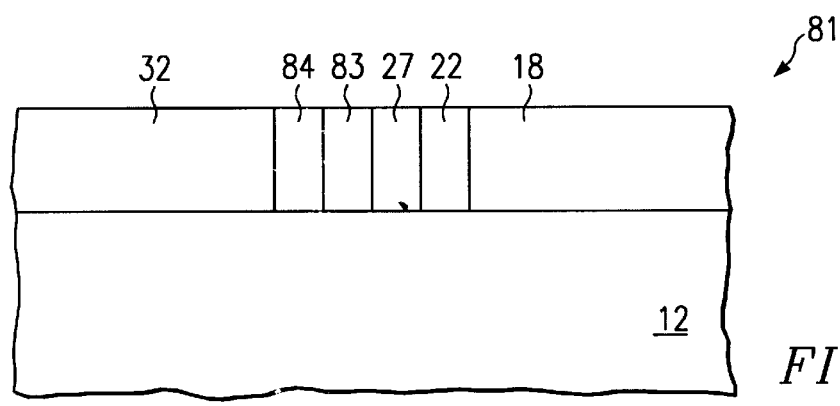
FIGS. 12–15 are diagrammatic sectional side views of an alternative embodiment of the integrated circuit of FIGS. 8–11, depicting respective successive stages during its fabrication according to an alternative form of the method which embodies the present invention.

Although FIG. 12 shows the sidewalls 83 and 27 as being separate, it will be recognized that a single sidewall could optionally be substituted for them, where the single sidewall had a width equal to the combined widths of the sidewalls 83 and 27. Also, although sidewalls 22 and 84 in FIGS. 12–13 are shown as being symmetric, they could alternatively be asymmetric.

Figure 13:
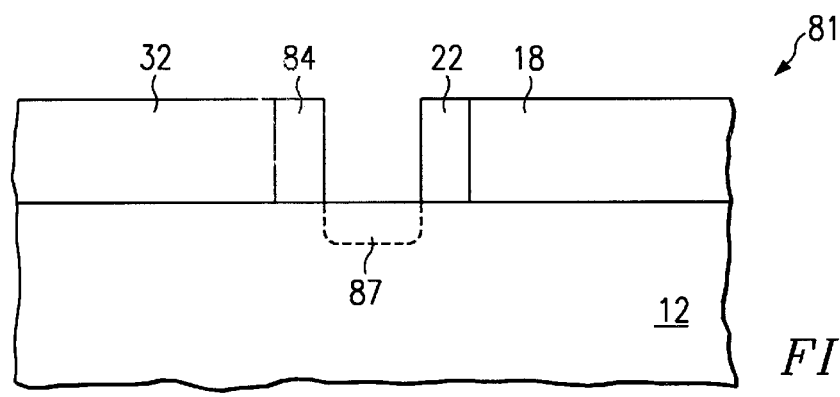

After the integrated circuit 81 has reached the stage of fabrication shown in FIG. 12, a selective etch is carried out in order to remove the two inner sidewalls 27 and 83, as shown in FIG. 13. An implant 87 is then introduced into the substrate 12, except in regions covered by the outer sidewalls 22 and 84 and the dielectric layers 18 and 32. In effect, the implant 87 is formed where the substrate 12 has been exposed as a result of the removal of the inner sidewalls 27 and 83. Following formation of the implant 87, the integrated circuit 81 has the configuration shown in FIG. 13.

Figure 14:
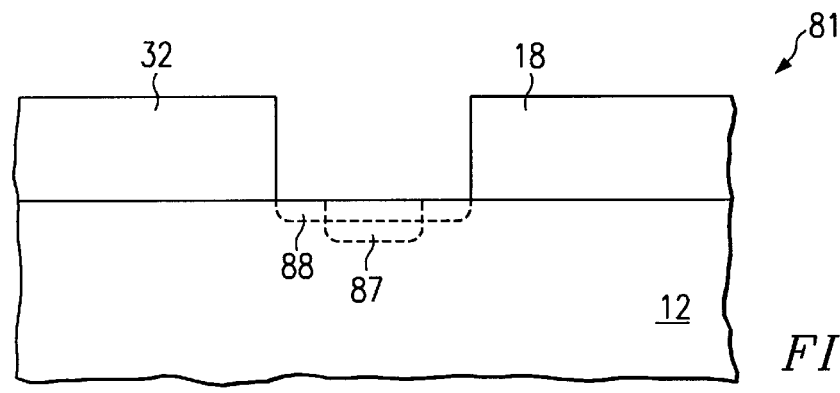

Next, a further selective etch is carried out in order to remove the two outer sidewalls 22 and 84, as shown in FIG. 14. Then, a further implant 88 is introduced into the substrate 12, except in the region of the dielectric layers 18 and 32. In effect, the implant 88 is introduced where the substrate 12 is exposed as a result of the removal of the four sidewalls 22, 27 and 83–84. Following introduction of the implant 88 into the substrate 12, the integrated circuit 81 has the configuration shown in FIG. 14.

Figure 15:
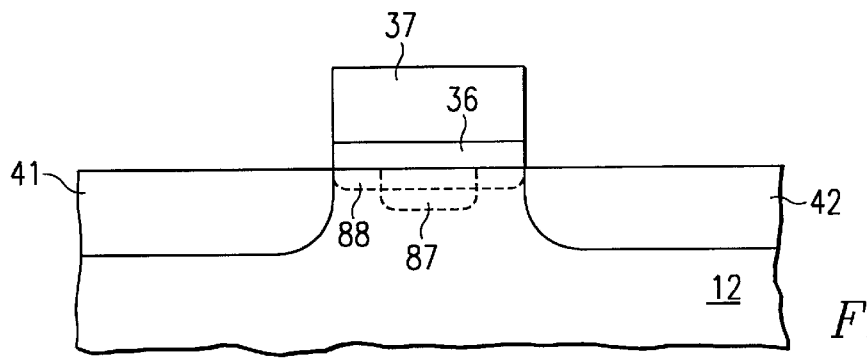

Subsequent fabrication of the integrated circuit 81 is then carried out in a manner similar to that described above for other embodiments, in order to obtain the structural configuration shown in FIG. 15. This includes formation of the gate structure 36–37, removal of the dielectric layers 18 and 32, and creation of the source and drain regions 41–42. It will be recognized from FIG. 15 that, in the channel region between the source and drain regions 41–42, there is a symmetric implant profile which is sublithographic and increases progressively from each of the source and drain toward the center of the channel. However, it will also be recognized from the foregoing discussion that there are variations to the process of making the integrated circuit 81 which would cause the implant profile in the channel region to be asymmetric, or to be of a size which is not sublithographic.

Figure 16:
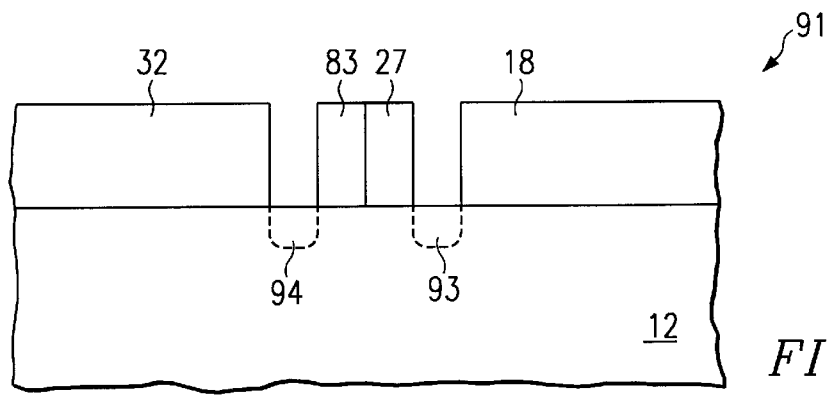
FIGS. 16–17 are diagrammatic sectional side views of an alternative embodiment of the integrated circuit of FIGS. 12–15, depicting respective successive stages during its fabrication according to an alternative form of the method which embodies the present invention.
Figure 17:
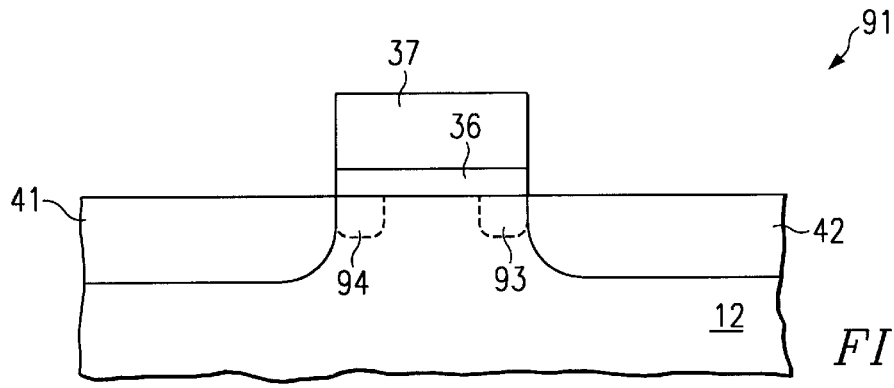

FIGS. 16–17 are diagrammatic sectional side views of an integrated circuit 91 which is an alternative embodiment of the integrated circuit 81 shown in FIGS. 12–15. Initial fabrication of the integrated circuit 91 is carried out in the same manner as described above for the integrated circuit 81 in association with FIG. 12. Then, a selective etch is carried out in order to remove the two outer sidewalls (22 and 84 in FIG. 12), leaving the dielectric layers 18 and 32 and the inner sidewalls 27 and 83, as shown in FIG. 16. An implant procedure is then carried out in order to introduce two spaced implant regions 93 and 94 into the substrate 12, at locations where the substrate has been exposed as a result of the removal of the outer sidewalls 22 and 84. Following formation of the implants 93 and 94, the integrated circuit 91 has the configuration shown in FIG. 16.

Next, the inner sidewalls 27 and 83 are removed by a selective etch process, and then further fabrication is carried out in a manner similar to that described above in association with the embodiment of FIGS. 12–15, in order to obtain the configuration of the integrated circuit 91 which is shown in FIG. 17. This includes formation of a gate structure 36–37 between the dielectric layers 18 and 32, removal of the dielectric layers 18 and 32 through a selective etch, and formation of source and drain regions 41 and 42 on opposite sides of the gate structure 36–37. The implants 93 and 94 serve as source and drain extensions, which are more lightly doped than the source and drain regions themselves. The implants 93 and 94 may also be referred to as pockets. It should be noted that the implants or pockets 93 and 94 are not in the source or drain regions 41–42, and thus provide the advantage of reduced junction capacitance.

In FIG. 17, the implants 93 and 94 are shown as being symmetric, but it will be recognized that they could alternatively be formed so that they are asymmetric. Also, although FIG. 16 shows the use of two sidewalls 83 and 27 which are separate, it will be recognized that a single sidewall could optionally be substituted for them, where the single sidewall had a width equal to the combined widths of the sidewalls 83 and 27.

Not all of the transistors in a particular integrated circuit need to be made according to the present invention. Some can be made according to the invention, and others can be made using traditional techniques. With respect to those that are made according to the present invention, appropriate masking can control how many sidewalls are added, such that more sidewalls are used for some transistors than for others. Moreover, the present invention does not preclude the use of gate material to interconnect gates as well as form the gate structure itself. For example, when polysilicon material is deposited in order to form two gate electrodes, a portion of the same deposited material may simultaneously form an interconnect between those two gate electrodes.

The invention is compatible with the fabrication of multiple gate lengths. For example, through use of appropriate masking during the formation of sidewalls, the a different number of sidewalls can be used for each of two transistors in a single integrated circuit, such that they end up having different gate lengths. In addition, other transistors on the same integrated circuit could be formed using traditional techniques rather than the techniques of the present invention, which would also result in various different gate lengths.

The invention is also compatible with the use of gate material to form interconnects as well as to form the actual gate electrodes. As one example, when a polysilicon material is deposited on the integrated circuit to form the gate electrodes of each of two spaced transistors, it may also fill a trench which extends between those two gate electrodes, so that in the resulting integrated circuit the gate electrodes are electrically coupled to each other by the polysilicon material in the trench.

The present invention provides a number of technical advantages. One such technical advantage is that the implant profile in the channel of a transistor can be tailored to have any of a wide variety of configurations which each vary at a sublithographic level, all without any need for close alignment considerations for lithographic steps which are involved. In this regard, although the disclosed embodiments show several specific examples of implant profiles, an advantage of the invention is that it is not restricted to these specific examples, but is suitable for use with a wide variety of implant profiles. A further advantage is that the channel length can be sublithographic and/or can be adjusted at a sublithographic level, also without close alignment considerations for the lithographic steps used during fabrication. A related advantage is that the channel profiling can be either symmetrical or asymmetrical. Further, the channel profiling can include the formation of source and drain extensions, and pocket implants that do not extend into the source and drain regions. Another advantage is that the present invention is compatible with multiple gate lengths, and with the use of gate material for interconnects as well as the actual gate electrodes.

Although several selected embodiments have been illustrated and described in detail, it will be recognized that various substitutions and alterations can be made therein without departing from the scope of the present invention. For example, the embodiments disclosed in the present application use from two to four sidewalls, but it will be recognized that the number of sidewalls used in the present invention is not limited to these specific values. A further example is that some of the disclosed embodiments carry out an implant step in association with the addition or removal of each sidewall, but it will be recognized that certain disclosed implant steps may be omitted, or additional implant steps could be carried out, because it is possible to vary the specific order in which implants are created and sidewalls are added or removed, in order to meet the particular needs of a given integrated circuit. Other substitutions and alterations are also possible without departing from the spirit and scope of the present invention, as defined by the following claims.

What is claimed is:

1. A method of fabricating an integrated circuit, comprising the steps of:

providing a substrate having an upwardly facing first surface;

introducing an implant layer introduced into the substrate through the upwardly facing first surface;

forming a dielectric layer on the upwardly facing first surface of the substrate;

etching the dielectric layer so as to define thereon a sidewardly facing second surface;

introducing a second implant layer into the substrate except where the dielectric layer blocks access to the substrate;

forming a first sidewall on said second surface, said first sidewall having on a side thereof opposite from the dielectric layer a sidewardly facing side surface;

introducing a third implant layer into the substrate from the upper side thereof, except in regions covered by the dielectric layer and the sidewardly facing side surface of the first sidewall;

forming a second sidewall on said sidewardly facing side surface of the first sidewall, said second sidewall having on a side thereof opposite the dielectric layer a sidewardly facing side surface;

introducing a fourth implant layer into the substrate from the upper side thereof, except in regions covered by the dielectric layer and the sidewardly facing side surfaces of the first and second sidewalls;

forming a second dielectric layer on the upwardly facing first surface of the substrate, side second dielectric layer having a side surface that engages the sidewardly facing side surface of the second sidewall; and removing said first and second sidewalls.

2. A method according to claim 1, wherein said steps of forming said first and second sidewalls is carried out so that each of said first and second sidewalls has a width which is sublithographic.

3. A method according to claim 1, wherein said step of forming said first and second sidewalls is carried out so that said first and second sidewalls have a cumulative width which is sublithographic.

4. A method according to claim 1, wherein said steps of introducing said first, second, third and fourth implant layers results in an implant profile in said substrate which is asymmetric in a direction perpendicular to said first surface.

5. A method according to claim 1, wherein said steps of introducing said first, second, third and fourth implants results in an implant profile in said substrate which is symmetric in a direction perpendicular to said first surface.

6. A method according to claim 1, wherein each of said first and second sidewalls are made of a material that can be selectively etched relative to the material of said first and second dielectric layers.

7. A method according to claim 6, wherein said first and second sidewalls are made of the same material.

8. A method according to claim 6, wherein said first sidewall is made of a material which is different from and can be etched relative to the material of said second sidewall.

9. A method of fabricating an integrated circuit, comprising the steps of:

providing a substrate having an upwardly facing first surface;

forming on said first surface a part which has thereon a second surface that faces sidewardly;

successively forming a plurality of sidewalls, including a first sidewall on said second surface and a second sidewall on said first sidewall;

removing said sidewalls;

introducing a plurality of successive implants into said substrate, wherein a respective different subset of said sidewalls is present when each said implant is introduced into said substrate; and forming on said first surface, after said step of forming said sidewalls and before said step of removing said sidewalls, a further part which has thereon a third surface that faces sidewardly toward said first surface and that engages one of said plurality of sidewalls which is farthest from said second surface.

10. A method according to claim 9, including after said step of said removing said sidewalls the step of forming on each of said first and third surfaces a further sidewall.

11. A method according to claim 9, including after said step of removing said sidewalls the step of removing from each of said parts a slice thereof which has thereon a respective one of said first and third surfaces.

12. A method according to claim 9, including after said steps of removing said sidewalls and introducing said implants, the steps of forming a gate structure between said first and third surfaces, thereafter removing said parts having thereon said first and third surfaces, and thereafter forming source and drain regions in said substrate on opposite sides of said gate structure.

13. A method as defined in claim 1, further comprising the step of: forming a transistor gate structure in the region which was occupied by the first and second sidewalls.

* * * * *